(12) United States Patent
Lach et al.

(10) Patent No.: US 9,484,229 B2
(45) Date of Patent: Nov. 1, 2016

(54) DEVICE AND METHOD FOR PROCESSING WAFER-SHAPED ARTICLES

(75) Inventors: Otto Lach, Treffen (AT); Christian Aufegger, Weissenstein (AT); Reinhold Schwarzenbacher, Kolbnitz (AT)

(73) Assignee: LAM RESEARCH AG, Villach (AT)

( * ) Notice: Subject to any disclaimer, the term of this patent is extended or adjusted under 35 U.S.C. 154(b) by 1294 days.

(21) Appl. No.: 13/295,878

(22) Filed: Nov. 14, 2011

(65) Prior Publication Data

US 2013/0118535 A1    May 16, 2013

(51) Int. Cl.
*H01L 21/00* (2006.01)
*H01L 21/67* (2006.01)

(52) U.S. Cl.
CPC ..... *H01L 21/67017* (2013.01); *H01L 21/6719* (2013.01); *H01L 21/67051* (2013.01); *H01L 21/67253* (2013.01); *Y10T 137/0318* (2015.04)

(58) Field of Classification Search
USPC ............. 134/104.2, 153, 157, 200, 902, 113, 134/149, 155, 186, 21, 85; 118/52, 54, 320, 118/730
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,352,593 B1 | 3/2002 | Brors et al. | |
| 7,052,577 B2 | 5/2006 | Obweger | |
| 7,270,137 B2 | 9/2007 | Yokomizo | |
| 7,837,803 B2 | 11/2010 | Hohenwarter | |
| 2003/0140949 A1 | 7/2003 | Sugimoto et al. | |
| 2004/0072450 A1 | 4/2004 | Collins et al. | |
| 2007/0175500 A1* | 8/2007 | Hohenwarter | ................ 134/149 |

FOREIGN PATENT DOCUMENTS

JP    2002305177    10/2002

OTHER PUBLICATIONS

International Search Report, dated Feb. 25, 2013, from corresponding PCT application.

* cited by examiner

*Primary Examiner* — David Cormier
*Assistant Examiner* — Thomas Bucci

(57) ABSTRACT

A device for processing wafer-shaped articles includes a spin chuck for holding and rotating a wafer-shaped article about a rotation axis and at least one dispenser for dispensing liquid onto at least one surface of a wafer-shaped article. A liquid collector surrounds the spin chuck for collecting liquid spun off the substrate during rotation, with at least two collector levels for separately collecting liquids in different collector levels. At least one lifting device moves the spin chuck relative to the liquid collector. At least two exhaust levels are provided for separately collecting gas from an interior of the liquid collector. Each of the exhaust levels includes at least one opening communicating with an ambient exterior of the liquid collector and a door that closes and opens the opening. Each door on one of the exhaust levels can be opened and closed separately from each door on another exhaust level.

9 Claims, 3 Drawing Sheets

DEVICE AND METHOD FOR PROCESSING WAFER-SHAPED ARTICLES

BACKGROUND OF THE INVENTION

1. Field of the Invention

The invention relates to a device and a method for processing wafer-shaped articles, such as semiconductor wafers, flat panel displays or optical discs.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

U.S. Pat. No. 4,903,717 discloses that its spin-chuck may be raised and lowered relative to a surrounding liquid collector that has plural liquid collecting levels and a common exhaust for collecting gas from the interior of the liquid collector.

U.S. Pat. No. 7,837,803 discloses an improved liquid and gas collector in which the exhaust at each of the levels may be individually controlled via valves provided at each of the levels. However, depending upon the particular process being performed upon the wafer-shaped article, the valves of that patent will come in contact with chemically aggressive fumes. It can be difficult to maintain such valves in good working order under such conditions.

There is therefore a need for a collector structure that can better prevent fumes from various media (e.g., acid, base, organic) from intermingling in a common process chamber, so as to prevent vapor cross-contamination. Such cross-contamination could result in the deposition of crystalline solids on delicate processing equipment, as well as various safety issues.

SUMMARY OF THE INVENTION

The invention in one aspect thus pertains to a device for processing wafer-shaped articles, comprising a spin chuck for holding and rotating a wafer-shaped article about a rotation axis, and at least one dispenser for dispensing a liquid onto at least one surface of a wafer-shaped article. A liquid collector surrounds the spin chuck for collecting liquid that is spun off the substrate during rotation, with at least two collector levels for separately collecting liquids in different collector levels. At least one lifting device is provided for moving the spin chuck relative to the liquid collector substantially along the rotation axis. At least two exhaust levels collect gas from an interior of the liquid collector, and each of these exhaust levels comprises at least one opening communicating with an ambient exterior of the liquid collector and a door that closes and opens the at least one opening. Each door on one of the at least two exhaust levels can be opened and closed separately from each door on another of the at least two exhaust levels.

In preferred embodiments of the device according to the invention, an actuator is provided for each door.

In preferred embodiments of the device according to the invention, the actuator is manually operated.

In preferred embodiments of the device according to the invention, it further comprises a computer that automatically calculates a position for each door of each of said at least two exhaust levels.

In preferred embodiments of the device according to the invention, a motorized mechanism moves each said door to said position calculated by said computer.

In preferred embodiments of the device according to the invention, the computer automatically calculates a position for each door of each of said at least two exhaust levels based on a vertical position of said spin chuck relative to said liquid collector.

In preferred embodiments of the device according to the invention, the computer automatically calculates a position for each door of each of said at least two exhaust levels based on measured gas pressures within said liquid collector.

In preferred embodiments of the device according to the invention, each of said exhaust levels comprises a series of said openings extending over a peripheral region of said liquid collector, and wherein said door is a plate having a corresponding series of spaced apart windows, the door being movable relative to said series of openings so as progressively to cover and uncover said series of openings.

In preferred embodiments of the device according to the invention, at least one of said at least two exhaust levels is in gaseous communication with a corresponding one of said at least two collector levels.

In another aspect, the invention relates to a method of controlling gas flow within a device for processing wafer-shaped articles, comprising:

wet treating a wafer-shaped article positioned on a spin-chuck for holding and rotating the wafer-shaped article by dispensing a liquid onto at least one surface of said substrate from at least one dispenser, wherein the spin chuck is surrounded by a liquid collector for collecting liquid that is spun off the substrate during rotation, said liquid collector having at least two collector levels for separately collecting liquids, and at least two exhaust levels for separately collecting gas from an interior of the liquid collector; and individually opening and closing each of a plurality of doors that are each adapted to seal a corresponding plurality of openings formed on each of said at least two collector levels.

In preferred embodiments of the method according to the invention, the doors are opened and closed so as to achieve substantially the same gas pressure adjacent to the rotating wafer-shaped article above and below said wafer-shaped article.

In preferred embodiments of the method according to the invention, the doors are manually actuated.

In preferred embodiments of the method according to the invention, a position for each door of each of said at least two exhaust levels is automatically calculated.

In preferred embodiments of the method according to the invention, each said door is moved by a motorized mechanism to a position calculated by a computer.

In preferred embodiments of the method according to the invention, the computer automatically calculates a position for each door of each of said at least two exhaust levels based on a vertical position of said spin chuck relative to said liquid collector.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION

Figure 1:
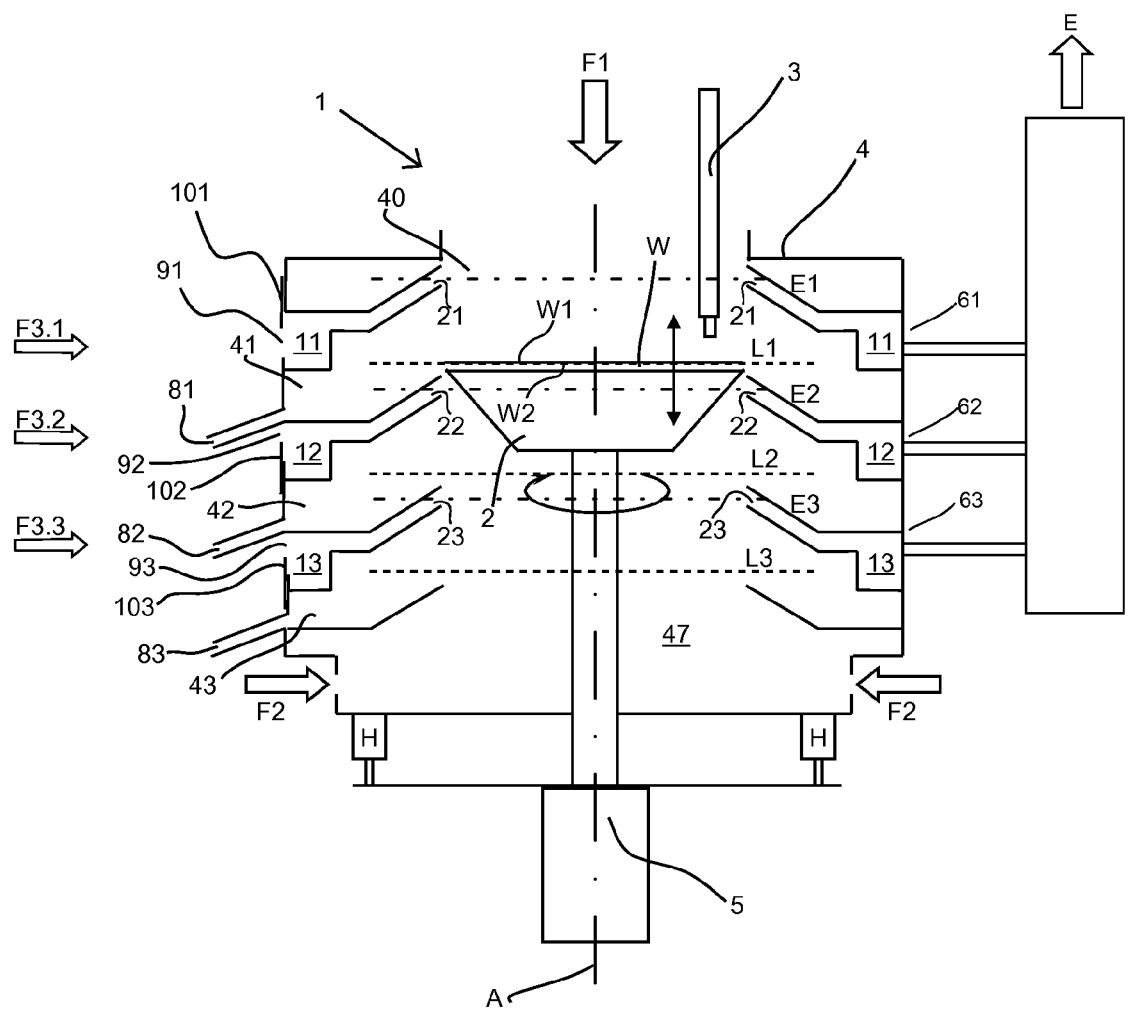
FIG. 1 shows a schematic cross section of a first embodiment of a device according to the present invention.

FIG. 1 shows a device 1 comprising a spin chuck 2 for holding and rotating a wafer W. The wafer has a first side W1 and a second side W2. The spin chuck 2 is connected to a gear motor unit 5 to be rotated about its axis A. Dispense arm 3 is used for dispensing liquid onto the first surface W1 of the substrate W. Wafer W may for example be a 300 mm or 450 mm silicon wafer undergoing any of various front-end-of-line (FEOL), middle-of-line, (MOL), or back-end-of-line (BEOL) processes, including associated cleaning and drying processes.

A cup-like liquid collector 4 circumferentially surrounds the spin chuck 2. The liquid collector is preferably mounted on a frame (not shown). Lifting devices H, such as hydraulic jacks or pneumatic cylinders, are provided to alter the spin chuck position relative to the liquid collector, in this case by raising the liquid collector 4. The spin chuck 2 can thus be positioned at each of the three collector levels L1, L2 and L3.

Each collector level L1, L2, L3 comprises an annular duct 41, 42, 43 that collects spun-off process liquid. An additional splash guard (not shown) can be used for each collector level to allow spun-off liquid to hit it at an acute angle and thereafter to be directed to the annular duct. Each annular duct 41, 42, 43 is connected to a pipe 81, 82, 83 through which the collected liquid is drained. Drained liquid can immediately be reused to be dispensed to the substrate, or collected as waste liquid. Each collector level L1, L2, L3 is preferably used to collect respectively different liquids. For example, L1 may be used for collecting rinse liquid such as deionized water, L2 may be used for acidic liquids and L3 may be used for basic liquids.

The dashed lines in FIG. 1 indicate the relative positions where the substrate is to be placed for spinning off the liquids into the different collector levels.

Above each collector level L1, L2, L3 an exhaust level E1, E2, E3 is arranged substantially parallel to the collector level. The position of the spin chuck 2 at each of the exhaust levels is shown in phantom line.

Each exhaust level comprises a plurality of interiorly open annularly arranged ducts 21, 22, 23. Each array of the plurality of ducts 21, 22 or 23 is connected to a separate ring-shaped gas-collecting chamber 11, 12, 13, respectively.

Each gas-collecting chamber 11, 12, 13 is connected by a respective exhaust pipe 61, 62, 63 to an exhaust unit, which comprises a fan or the like to draw exhaust gases from the collector and discharge those gases as depicted by the arrow E. Each gas-collecting chamber 11, 12, 13 also has at least one opening 91, 92, 93, by which each gas-collecting chamber may be exposed and equalized with an exterior ambient of the collector 2, independently of all other gas-collecting chambers. Each opening 91, 92, 93 may be opened and closed by a respective door 101, 102, 103. Each door 101, 102 and 103 may be opened and closed individually and independently of each other door 101, 102 and 103.

Whereas gas will largely exit the collector 2 through exhaust pipes 61, 62, 63, gas will enter collector 2 largely from above and below, as indicated by the arrows F1 and F2 in FIG. 1. The flow volume along arrow F1 typically exceeds that along arrows F2, resulting in a higher pressure above the spin chuck 2 and a lower pressure below the spin chuck 2. In the absence of openings 91, 92 and 93, and doors 101, 102, 103 for individually opening and closing the same, such a pressure differential could cause mixing of gases present at different collector levels. In the presence of the openings 91, 92, 93 selective and individual air flow along arrows F3.1, F3.2, F3.3 is permitted, and thus a possibly negative relative pressure underneath the chuck can be avoided and thus cross-contamination can be avoided.

Figure 2:
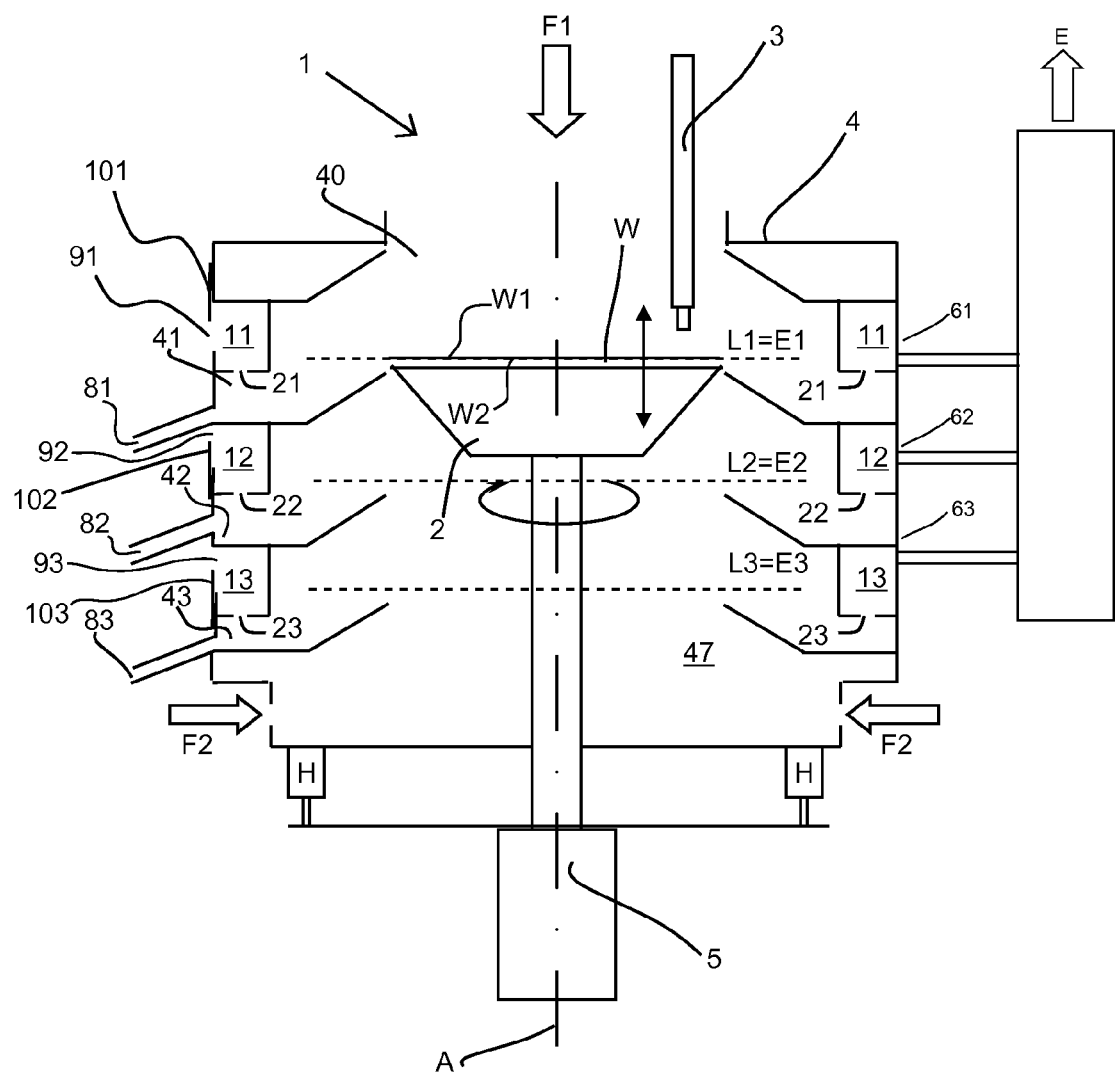
FIG. 2 shows a schematic cross section of a second embodiment of a device according to the present invention.

FIG. 2 shows a second embodiment of the invention, which is similar to the first embodiment except that exhaust orifices 21, 22, 23 place the annular ducts 41, 42, 43 in communication with the gas-collecting chambers 11, 12, 13, respectively. Thus, the collector levels L1, L2, L3 serve at the same time as exhaust levels E1, E2, E3.

Figure 3:
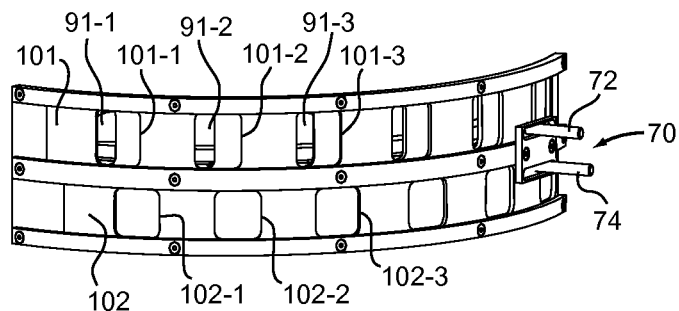
FIG. 3 illustrates an embodiment of a door structure for use in the device and method according to the present invention, in a first position.
Figure 4:
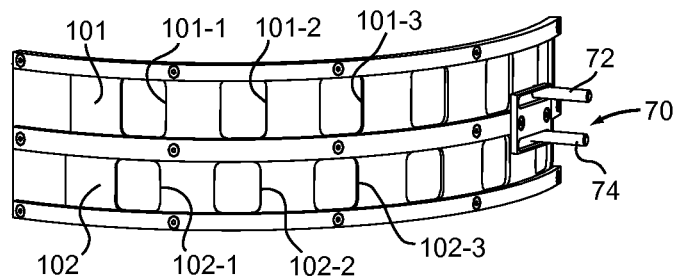
FIG. 4 illustrates an embodiment of a door structure for use in the device and method according to the present invention, in a second position.
Figure 5:
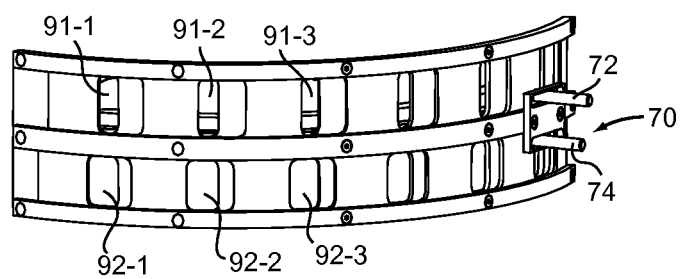
FIG. 5 illustrates an embodiment of a door structure for use in the device and method according to the present invention, in a third position.

FIGS. 3-5 show a possible configuration for the doors, in each of three different combinations. With reference to FIG. 3, two collector levels are depicted, showing from the outside of the collector only that region where openings 91 and 92 are formed. It will be appreciated that the doors are formed over a given angular range of the annular collector levels, for example about $\frac{1}{6}^{th}$ or 60° of the circumference of each level, whereas the exhaust unit E and its associated conduits 61, 62, 63 will be positioned at a separate portion of each collector level. Thus, the action of the exhaust unit withdrawing gas from the collector draws ambient air into the individual collector levels through openings 91 and 92 at flow rates determined by the extent to which those openings are uncovered.

In particular, the upper collector level has five openings 91, numbered 91-1, 91-2, 91-3 . . . . The openings 91 are partially covered by door 101, which has the form of a slide or shutter having windows 101-1, 101-2, 101-3 . . . , which correspond in number, size and spacing to the openings 91.

The lower collector level has five openings 92 (visible only in FIG. 5), numbered 92-1, 92-2, 92-3 . . . . The openings 92 are partially covered by door 102, which has the form of a slide or shutter having windows 102-1, 102-2, 102-3 . . . , which correspond in number, size and spacing to the openings 92.

An actuator 70 is mounted on the exterior of the collector 2, and comprises a pair of control arms 72, 74, with arm 72 being connected to door 101 and arm 74 being connected to door 102. Arms 72, 74 may be moved independently of one another, and may be actuated manually or automatically.

In case of automatic actuation, the device is equipped with a computer that receives information about the relative position of the spin chuck to the liquid collector either directly from the lifting devices or from electronic detectors that detect the position.

In FIG. 3, the door 101 has been moved to a position where the openings 91 are in communication with the exterior ambient of the liquid collector 2. Door 102 has been moved to a position where openings 92 are entirely covered. In FIG. 4, doors 101 and 102 have been moved to a position where openings 91 and 92 are all covered, whereas in FIG. 5, doors 101 and 102 have been moved to a position where openings 91 and 92 are all in communication with the exterior ambient of collector 102.

It will be appreciated that the sliding structure depicted in FIGS. 3-5 permits controlling the extent to which the doors 101 and 102 overlap the openings 91 and 92, respectively, and thus permits fine-tuning the pressure control within the collector levels.

In case the doors 101 and 102 as depicted in FIGS. 3-5 are controlled automatically, a computer instructs an appropriate mechanism (not shown) to act upon the arms 72, 74 of actuator 70. As noted above, the opening and/or closing of doors 101 and 102, as well as the extent of opening thereof, may be selected based upon the relative vertical position of the spin chuck to the collector. It is also contemplated to provide pressure sensors within the collector levels whose readings are supplied to the computer, which in turn adjusts the position of doors 101 and 102 so as to equalize an internal pressure above and below the spin chuck, utilizing the sensor readout as feedback.

The discovery by the present inventors that the pressure differentials within a liquid collector can be adequately compensated by selectively placing the collector levels in gaseous communication with the exterior ambient of the liquid collector, permits omitting from such a device the individual exhaust valves of the prior art described above, as well as their associated control mechanisms.

What is claimed is:

1. Device for processing wafer-shaped articles, comprising:
    a spin chuck for holding and rotating a wafer-shaped article about a rotation axis;
    at least one dispenser for dispensing a liquid onto at least one surface of a wafer-shaped article;
    a liquid collector surrounding said spin chuck for collecting liquid that is spun off a wafer-shaped article during rotation, with at least two collector levels for separately collecting liquids in different collector levels;
    at least one lifting device for moving said spin chuck relative to said liquid collector substantially along said rotation axis;
    at least two exhaust levels for collecting gas from an interior of the liquid collector, wherein each of said exhaust levels is in communication with an exhaust through a conduit;
    wherein each of said exhaust levels further comprises at least one opening communicating with an ambient exterior of said liquid collector and a door that closes and opens said at least one opening;
    wherein each said door on one of said at least two exhaust levels can be opened and closed separately from each said door on another of said at least two exhaust levels.

2. The device according to claim 1, further comprising an actuator for each said door.

3. The device according to claim 2, wherein said actuator is manually operated.

4. The device according to claim 1, further comprising a computer that automatically calculates a position for each door of each of said at least two exhaust levels.

5. The device according to claim 4, further comprising a motorized mechanism that moves each said door to said position calculated by said computer.

6. The device according to claim 4, wherein said computer automatically calculates a position for each door of each of said at least two exhaust levels based on a vertical position of said spin chuck relative to said liquid collector.

7. The device according to claim 4, wherein said computer automatically calculates a position for each door of each of said at least two exhaust levels based on measured gas pressures within said liquid collector.

8. The device according to claim 1, wherein each of said exhaust levels comprises a series of said openings extending over a peripheral region of said liquid collector, and wherein said door is a plate having a corresponding series of spaced apart windows, the door being movable relative to said series of openings so as progressively to cover and uncover said series of openings.

9. The device according to claim 1, wherein at least one of said at least two exhaust levels is in gaseous communication with a corresponding one of said at least two collector levels.

* * * * *